(12) United States Patent
Kanaya

(10) Patent No.: US 11,482,572 B2
(45) Date of Patent: Oct. 25, 2022

(54) SEMICONDUCTOR MEMORY DEVICE WITH RESISTANCE CHANGE MEMORY ELEMENT AND MANUFACTURING METHOD OF SEMICONDUCTOR MEMORY DEVICE WITH RESISTANCE CHANGE MEMORY ELEMENT

(71) Applicant: KIOXIA CORPORATION, Tokyo (JP)

(72) Inventor: Hiroyuki Kanaya, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 148 days.

(21) Appl. No.: 17/003,759

(22) Filed: Aug. 26, 2020

(65) Prior Publication Data

US 2021/0257413 A1 Aug. 19, 2021

(30) Foreign Application Priority Data

Feb. 17, 2020 (JP) .............................. JP2020-024186

(51) Int. Cl.
*H01L 27/24* (2006.01)
*G11C 8/14* (2006.01)
(Continued)

(52) U.S. Cl.
CPC ............ *H01L 27/2481* (2013.01); *G11C 7/18* (2013.01); *G11C 8/14* (2013.01); *G11C 11/1659* (2013.01);
(Continued)

(58) Field of Classification Search
CPC ... H01L 27/2481; H01L 27/222; H01L 43/08; H01L 45/142; H01L 45/143; H01L 45/144; H01L 27/2463; H01L 45/1273; H01L 27/224; H01L 27/2427; H01L 45/04; H01L 45/1233; H01L 45/1683; H01L 43/12;
(Continued)

(56) References Cited

U.S. PATENT DOCUMENTS 9,070,874 B2 * 6/2015 Sills ...................... H01L 45/085
9,425,237 B2   8/2016 Jo
(Continued)

FOREIGN PATENT DOCUMENTS

JP       2010-62265 A    3/2010
JP       2019-114644 A   7/2019

*Primary Examiner* — Jerome Leboeuf
(74) *Attorney, Agent, or Firm* — Kim & Stewart LLP

(57) ABSTRACT

A semiconductor memory device has a first wiring extending in a first direction and a second wiring extending in a second direction. The first and second wirings are spaced from each other in a third direction. The second wiring has a first recess facing the first wiring. A resistance change memory element is connected between the first and second wirings. A conductive layer is between the resistance change memory element and the second wiring and includes a first protrusion facing the second wiring. A switching portion is between the conductive layer and the second wiring and includes a second recess facing the conductive layer and a second protrusion facing the second wiring. The first protrusion is in the second recess. The second protrusion is in the first recess. The switching portion is configured to switch conductivity state according to voltage between the first wiring and the second wiring.

20 Claims, 11 Drawing Sheets

(51) Int. Cl.
*H01L 27/22* (2006.01)
*H01L 43/08* (2006.01)
*H01L 45/00* (2006.01)
*G11C 7/18* (2006.01)
*G11C 11/16* (2006.01)
*G11C 13/00* (2006.01)

(52) U.S. Cl.
CPC ........ *G11C 13/003* (2013.01); *G11C 13/0004* (2013.01); *H01L 27/222* (2013.01); *H01L 43/08* (2013.01); *H01L 45/142* (2013.01); *H01L 45/143* (2013.01); *H01L 45/144* (2013.01); *G11C 2213/52* (2013.01); *G11C 2213/76* (2013.01)

(58) Field of Classification Search
CPC ......... G11C 7/18; G11C 8/14; G11C 11/1659; G11C 13/0004; G11C 13/003; G11C 2213/52; G11C 2213/76; G11C 11/161; G11C 2213/72
See application file for complete search history.

(56) References Cited

U.S. PATENT DOCUMENTS

| | | | |
|---|---|---|---|
| 9,997,705 | B2 | 6/2018 | Tour et al. |
| 2007/0045605 | A1* | 3/2007 | Hsueh ................. H01L 45/1683 257/E29.17 |
| 2011/0227030 | A1* | 9/2011 | Pickett .................. H01L 45/146 257/4 |
| 2012/0104353 | A1* | 5/2012 | Lee ..................... H01L 27/2481 257/E47.001 |
| 2017/0338279 | A1* | 11/2017 | Yang ..................... H01L 27/224 |
| 2018/0240844 | A1* | 8/2018 | Yang ..................... H01L 27/224 |
| 2018/0261270 | A1 | 9/2018 | Yoshikawa et al. |
| 2021/0074765 | A1* | 3/2021 | Reznicek ............. H01L 45/146 |

* cited by examiner

SEMICONDUCTOR MEMORY DEVICE WITH RESISTANCE CHANGE MEMORY ELEMENT AND MANUFACTURING METHOD OF SEMICONDUCTOR MEMORY DEVICE WITH RESISTANCE CHANGE MEMORY ELEMENT

CROSS-REFERENCE TO RELATED APPLICATION(S)

This application is based upon and claims the benefit of priority from. Japanese Patent Application No. 2020-024186, filed Feb. 17, 2020, the entire contents of which are incorporated herein by reference.

FIELD

Embodiments described herein relate generally to a semiconductor memory device and a manufacturing method of a semiconductor memory device.

BACKGROUND

A magnetic storage device, such as magnetoresistance random access memory (MRAM) using a magnetoresistance effect element as a memory element is known.

DETAILED DESCRIPTION

Figure 1:
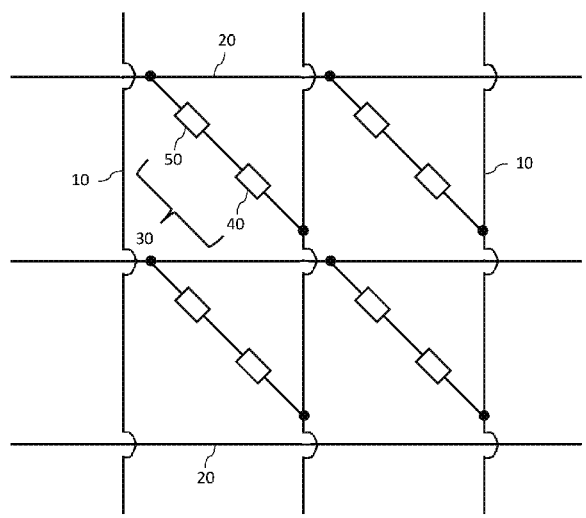
FIG. 1 is an equivalent circuit diagram of a semiconductor memory device according to a first embodiment.

Embodiments provide a semiconductor memory device capable of performing stable writing and reading operations and a manufacturing method of the semiconductor memory device.

In general, according to one embodiment, a semiconductor memory device comprises a first wiring extending in a first direction and a second wiring extending in a second direction intersecting the first direction. The second wiring is spaced from the first wiring in a third direction intersecting the first direction and the second direction. The second wiring has a first recess on a surface facing the first wiring. A resistance change memory element is connected between the first and second wirings. A conductive layer is between the resistance change memory element and the second wiring and includes a first protrusion on a surface facing the second wiring. A switching portion is between the conductive layer and the second wiring. The switching portion includes a second recess on a surface facing the conductive layer and a second protrusion on a surface facing the second wiring. The first protrusion is in the second recess. The second protrusion is in the first recess. The switching portion is configured to switch a conductivity state according to a voltage difference applied between the first and second wirings.

Hereinafter, a semiconductor memory device of certain example embodiments will be described with reference to the drawings. The drawings are schematic and, for example, the relationship between the thickness and the plane dimension, the ratio of the thickness of each layer, and the like may differ from the actual ones. Furthermore, in these embodiments, elements that are substantially the same as one another are denoted by the same reference numerals, and the descriptions thereof may be omitted.

The disclosed embodiments can be used in various types of memories, such as a magnetoresistance random access memory (MRAM), a resistance random access memory (ReRAM), a phase-change random access memory (PRAM), and a ferroelectric random access memory (FeRAM). In the following, MRAM will be described as a non-limiting example of a resistance change type memory. MRAM is a memory that includes a magnetic tunnel junction (MTJ) element, which uses a tunneling magnetoresistance (TMR) effect, as a memory element and stores information according to the magnetization state of the MTJ element. Rewriting of data may be performed using, for example, a spin injection method. In this context, a spin injection method is a method of directly rewriting the magnetization of the MTJ element by causing electrons whose magnetization direction is polarized in one direction to flow into the MTJ element.

(1) First Embodiment

A semiconductor memory device 100 and a manufacturing method thereof according to a first embodiment will be described with reference to FIGS. 1 to 19.

(1)-(a) Configuration Example

The semiconductor memory device 100 according to the first embodiment will be described with reference to FIGS. 1 to 4.

FIG. 1 is an equivalent circuit diagram of the semiconductor memory device 100. The semiconductor memory device 100 may also be referred to as a semiconductor integrated circuit device in some contexts.

Figure 2:
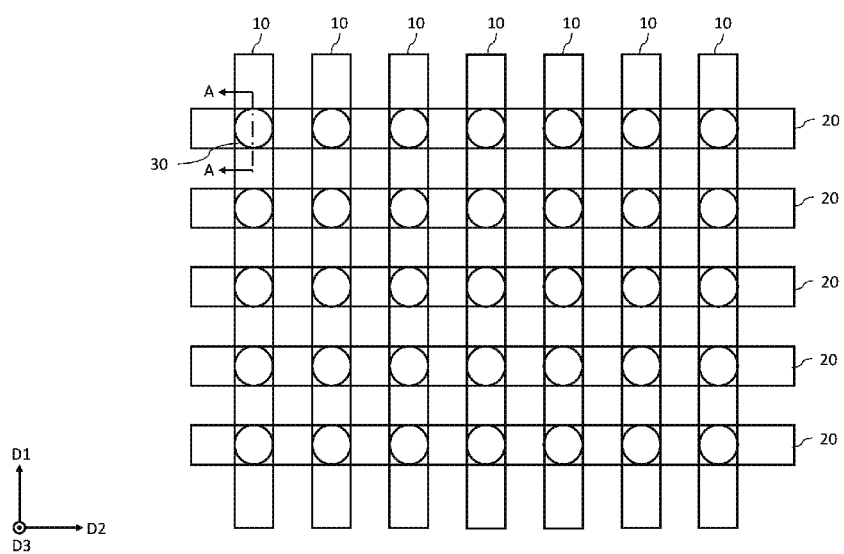
FIG. 2 is a plan view of a semiconductor memory device according to a first embodiment.

FIG. 2 is a plan view of the semiconductor memory device 100. For convenience, in the following description, a third direction D3 will be referred to as an upward direction, and the direction opposite to the third direction D3 will be referred to as a downward direction. Such terms do not necessarily refer to gravitational directions.

In the semiconductor memory device 100, a plurality of memory cells 30 are provided between a plurality of first wirings 10 and a plurality of second wirings 20. The semiconductor memory device 100 has a structure that can select one individual memory cell 30 by a selection of one first wiring 10 and one second wiring 20. Furthermore, a structure in which a plurality of these structures are stacked at different levels in the third direction D3 may be used. The first wiring 10, the second wiring 20, and the memory cell 30 are provided on the upper surface side of a semiconductor substrate. Transistors and wirings for peripheral circuits are also usually provided on the upper surface side of the semiconductor substrate.

Each of the first wirings 10 extends in a first direction D1, and each of the second wirings 20 extends in a second direction D2. The first direction D1 and the second direction D2 intersect with each other. In this example, the first wiring 10 is provided on the upper layer side of the memory cell 30, and the second wiring 20 is provided on the lower layer side of the memory cell 30. That is, the first wiring 10 is an upper level wiring and the second wiring 20 is a lower level wiring. The first wiring 10 may be referred to as a bit line BL and the second wiring 20 may be referred to as a word line WL. Alternatively, in other examples, the first wiring 10 may be referred to as a word line WL and the second wiring 20 may be referred to as a bit line BL.

Each memory cell 30 is connected between a first wiring 10 and a second wiring 20. Each memory cell 30 comprises a magnetoresistance effect element 40 and a selector 50 connected in series. The magnetoresistance effect element 40 may be referred to as a nonvolatile resistance change memory element. The memory cell 30 in this example has a structure in which the magnetoresistance effect element 40 and the selector 50 are stacked. The magnetoresistance effect element is also referred to as an MTJ element.

As shown in FIG. 2, when viewed from the third direction D3 (that is, the stacking direction of the magnetoresistance effect element 40 and the selector 50) perpendicular to the first direction D1 and the second direction D2, memory cells 30 are arranged on the first wiring 10 at predetermined intervals along the first direction D1. When viewed from the third direction D3, memory cells 30 are arranged on the second wiring 20 at predetermined intervals along the second direction.

Figure 3:
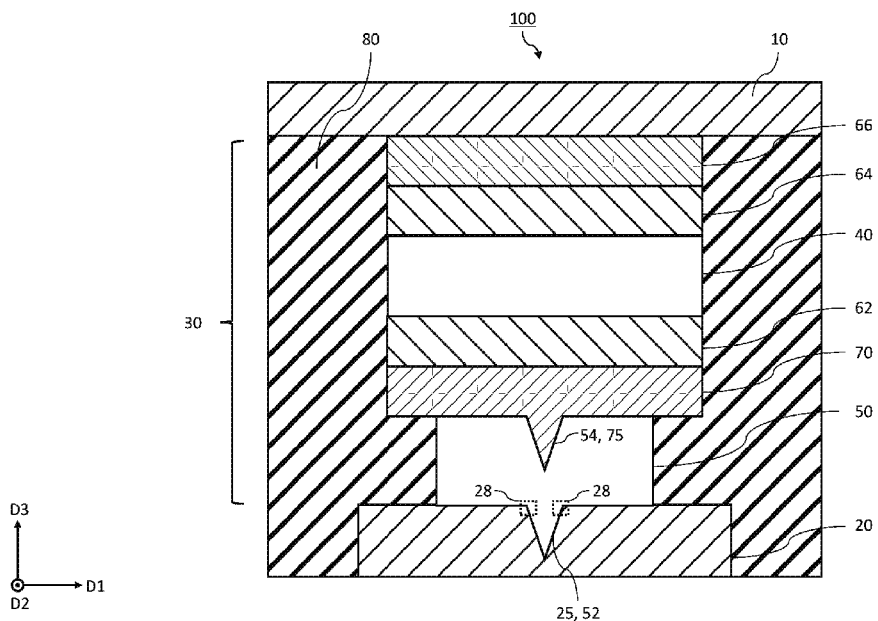
FIG. 3 is a cross-sectional view of a semiconductor memory device according to a first embodiment.

FIG. 3 is a cross-sectional view of the semiconductor memory device 100 taken along the line A-A in FIG. 2 (a cross-sectional view parallel to the plane defined by the first direction D1 and the third direction D3 in FIG. 2). The illustration of the semiconductor substrate provided on the lower surface side of the second wiring 20 is omitted from this depiction.

As shown in FIG. 3, in each semiconductor memory device 100, a memory cell 30 is provided between a first wiring 10 and a second wiring 20. The second wiring 20 includes a first recess portion 25 on the upper surface on the selector 50 side. The first recess portion 25 is a groove or trench and extends lengthwise in the second direction D2 and depthwise in the third direction D3 into the second wiring 20. The first recess portion 25 is preferably a V-shaped groove having a pointed tip in a cross section taken along the line A-A in FIG. 2. Having a pointed tip here includes the case the tip thereof is sharp and also the case the width of the tip thereof in the first direction D1 is smaller than one third of the maximum width of a second protrusion portion 52 in the first direction D1 within the plane defined by the first direction D1 and the third direction D3.

In addition, the first recess portion 25 includes an edge portion 28. In other words, the surface of the second wiring 20 on the first wiring 10 side, within the plane defined by the first direction D1 and the third direction D3, has the edge portion 28. The edge portion 28 protrudes in a direction approaching an end of the first protrusion portion 75 in the third direction D3 such that a distance from an end of the first protrusion portion 75 in the third direction D3 becomes the minimum at an end of the first recess portion 25 in the first direction D1. The edge portion 28 extends along the second direction D2. The edge portion 28 preferably has a sharp angular structure, but may also have a slightly rounded shape so long as performance is within a range in which variations in a threshold voltage Vth can be prevented.

A second protrusion portion 52, which is a part of the selector 50, is embedded in the first concave portion 25. The memory cell 30 is provided within an interlayer insulating film 80. Each memory cell 30 includes a magnetoresistance effect element 40, a selector 50, a lower electrode 62, an upper electrode 64, a hard mask 66, and a conductive layer 70.

The selector 50 is provided on the second wiring 20 (which may also be referred to as a selector lower electrode). The conductive layer 70 (which may also be referred to as a selector upper electrode) is provided on the selector 50. The lower electrode 62 is provided on the conductive layer 70. The magnetoresistance effect element 40 is provided on the lower electrode 62. The upper electrode 64 is provided on the magnetoresistance effect element 40. The hard mask 66 is provided on the upper electrode 64. The first wiring 10 is provided on the hard mask 66.

The upper electrode 64 is provided between a shift cancellation layer 49 and the hard mask 66. The material of the upper electrode 64 includes, for example, at least one of a metal and a nitride thereof, such as tungsten (W), tantalum (Ta), titanium (Ti), tungsten nitride (WN), tantalum nitride (TaN), and titanium nitride (TiN). The upper electrode 64 may have a single-layer structure or a multi-layer structure.

The lower electrode 62 is provided between the conductive layer 70 and a base layer 44. The material of the lower electrode 62 includes, for example, at least one of a metal and a nitride thereof, such as tungsten (W), tantalum (Ta), titanium (Ti), tungsten nitride (WN), tantalum nitride (TaN), and titanium nitride (TiN). The lower electrode 62 may have a single-layer structure or a multi-layer structure.

Figure 4:
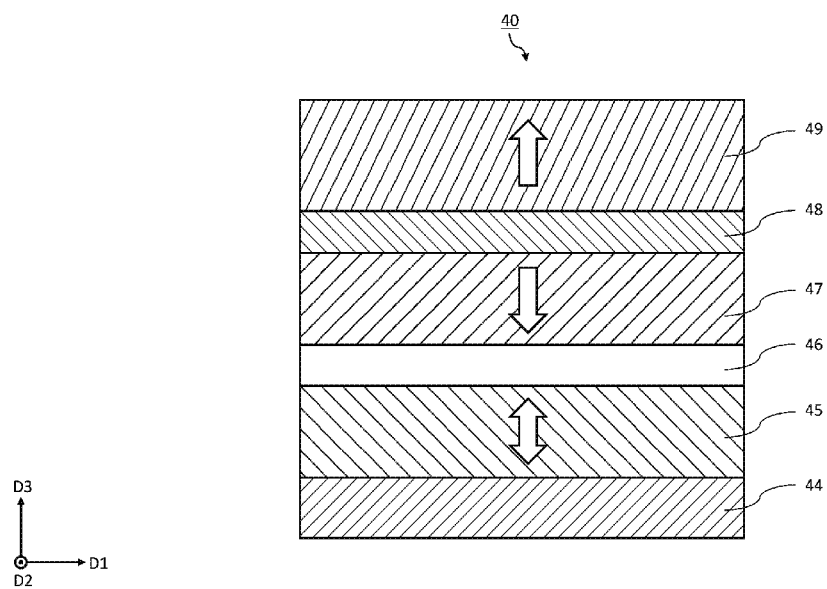
FIG. 4 is a cross-sectional view of a magnetoresistance effect element according to a first embodiment.

FIG. 4 is a cross-sectional view of the magnetoresistance effect element 40 used in the semiconductor memory device 100, taken along the line A-A of FIG. 2. In FIG. 4, the illustration of the interlayer insulating film 80 is omitted for simplification of description. The magnetoresistance effect element 40 is a multi-layer film having a magnetic tunnel junction. The magnetoresistance effect element 40 includes the base layer 44, a storage layer 45, a tunnel barrier layer 46, a reference layer 47, an intermediate layer 48, and the shift cancellation layer 49.

The base layer 44 is provided between the lower electrode 62 and the storage layer 45. The base layer 44 is a layer that can be used for improving the characteristics of the storage layer 45 (for example, magnetic characteristics, crystallinity, or the like) and/or the characteristics of the magnetic tunnel junction. The base layer 44 includes, for example, at least one of metal, boride, oxide, and nitride.

The storage layer 45 is provided between the base layer 44 and the tunnel barrier layer 46.

The storage layer 45 is made of a ferromagnetic material and has a variable magnetization direction. The variable magnetization direction means that the magnetization direction changes with respect to an application of a write current. The storage layer 45 is formed of, for example, a ferromagnetic material having a perpendicular magnetization characteristic. The storage layer 45 includes, for example, at least one of iron (Fe) and cobalt (Co). The storage layer 45 may include boron (B) in addition to iron (Fe) and cobalt (Co).

The storage layer 45 may be referred to as a free layer or a magnetic free layer.

The reference layer 47 is provided between the tunnel barrier layer 46 and the shift cancellation layer 49.

The reference layer 47 is made of a ferromagnetic material and has a fixed magnetization direction. In this context, fixed magnetization direction means that the magnetization direction does not change with respect to a write current utilized in the device. The reference layer 47 includes, for example, at least one of iron (Fe) and cobalt (Co). The reference layer 47 may include boron (B) in addition to iron (Fe) and cobalt (Co). The reference layer 47 may be referred to as a pinned layer, a magnetic fixed layer, a magnetic pinned layer, or a magnetization invariant layer.

The tunnel barrier layer 46 is provided between the storage layer 45 and the reference layer 47. The tunnel barrier layer 46 is an insulating layer interposed between the storage layer 45 and the reference layer 47. The tunnel barrier layer 46 includes magnesium (Mg) and oxygen (O), for example.

The shift cancellation layer 49 is provided between the reference layer 47 and the upper electrode 64.

The shift cancellation layer 49 is made of a ferromagnetic material. The shift cancellation layer 49 has a fixed magnetization direction antiparallel to the magnetization direction of the reference layer 47 and functions to cancel a magnetic field applied from the reference layer 47 to the storage layer 45. The shift cancellation layer 49 is made of, for example, a ferromagnetic material having a perpendicular magnetization characteristic, and includes at least one element of cobalt (Co), platinum (Pt), nickel (Ni), and palladium (Pd).

For example, the magnetization direction of the reference layer 47 and the magnetization direction of the shift cancellation layer 49 are set to opposite directions by a synthetic antiferromagnetic (SAF) structure.

In the SAF structure, the intermediate layer 48 is provided between the reference layer 47 and the shift cancellation layer 49. The reference layer 47 and the shift cancellation layer 49 are antiferromagnetically coupled by the intermediate layer 48. The intermediate layer 48 includes a non-magnetic metal such as ruthenium (Ru).

The magnetoresistance effect element 40 is a spin transfer torque (STT) type magnetoresistance effect element and has perpendicular magnetization. That is, the magnetization direction of the storage layer 45 is orthogonal to the upper surface thereof, the magnetization direction of the reference layer 47 is orthogonal to the upper surface thereof, and the magnetization direction of the shift cancellation layer 49 is orthogonal to the upper surface thereof.

The magnetoresistance effect element 40 is in a low resistance state when the magnetization direction of the storage layer 45 is parallel to the magnetization direction of the reference layer 47 and is in a high resistance state when the magnetization direction of the storage layer 45 is anti-parallel to the magnetization direction of the reference layer 47. Therefore, the magnetoresistance effect element 40 can store binary data values (0 or 1) according to the resistance state (low resistance state and high resistance state). The low resistance state or the high resistance state can be set in the magnetoresistance effect element 40 according to the direction of the current flowing in the magnetoresistance effect element 40.

The magnetoresistance effect element 40 shown in FIG. 4 has a bottom-free type configuration in which the storage layer 45, the tunnel barrier layer 46, and the reference layer are stacked in this order from the lower layer side (semiconductor substrate side). However, the magnetoresistance effect element 40 may instead be a top-free type configuration in which the reference layer 47, the tunnel barrier layer 46, and the storage layer 45 are stacked in this order from the lower layer side (semiconductor substrate side).

The conductive layer 70 is provided between the selector 50 and the lower electrode 62. The conductive layer 70 includes, for example, at least one of a metal and a nitride thereof, such as tungsten (W), tantalum (Ta), titanium (Ti), tungsten nitride (WN), tantalum nitride (TaN), and titanium nitride (TiN).

The conductive layer 70 includes a first protrusion portion 75 extending on the lower surface thereof in the second direction D2. In some examples, the conductive layer 70 may serve as the lower electrode 62 and be directly connected to the base layer 44. In this case, the distinct lower electrode 62 portion shown in FIG. 3 would be omitted. The first protrusion portion 75 preferably has a V-shape having a pointed tip in a cross section taken along the line A-A in FIG. 2. The first protrusion portion 75 is provided so as not to contact the second wiring 20. That is, the first protrusion portion 75 does not extend downward in the third direction D3 to meet the second wiring 20.

The selector 50 has a switching function (e.g., performs a switching operation between conductive and non-conductive states). Therefore, the selector 50 may be referred to as a switching element. For example, a two-terminal type switching element having a switching function is used. When the selector 50 is turned on, the magnetoresistance effect element 40 is selected and writing and reading can be performed on the magnetoresistance effect element 40. For example, a diode or a two-terminal type switching element including a chalcogen element may be used for the selector.

In the two-terminal type switching element including the chalcogen element described above, when the voltage applied between the two terminals is less than the threshold voltage, the switching element is in a high resistance state (for example, a substantially electrically non-conductive state). When the voltage applied between the two terminals becomes greater than the threshold voltage, the switching element shifts to a low resistance state (for example, an electrically conductive state). The switching element (selector 50) may have the above-described function in both directions. The switching element described above may include at least one of a chalcogen element selected from the group consisting of tellurium (Te), selenium (Se), and sulfur (S). Alternatively, the switching element may include chalcogenide which is a compound including these chalcogen elements.

The selector 50 includes the second protrusion portion 52 extending lengthwise in the second direction D2 on the lower surface thereof and also a second recess portion 54 extending lengthwise in the second direction D2 on the upper surface thereof. The second protrusion portion 52 is in the first recess portion 25 provided on the upper surface of the second wiring 20. The lower surface of the selector 50 and the upper surface of the second wiring 20 are in contact with each other. The second protrusion portion 52 is preferably angular so as to follow or match the shape of the edge portion 28 of the first recess portion 25. The second protrusion portion 52 preferably has a V-shape having a pointed tip in the cross section taken along the line A-A in FIG. 2.

The second recess portion 54 surrounds the first protrusion portion 75 provided on the lower surface of the conductive layer 70. The upper surface of the selector 50 and the lower surface of the conductive layer 70 are in contact with each other. The second recess portion 54 is preferably a V-shaped groove having a pointed tip in the cross section taken along the line A-A in FIG. 2. The first protrusion portion 75 and the second protrusion portion 52 are aligned in the third direction D3. The second recess portion 54 is preferably provided in the middle of a width in the first direction D1 of the selector 50.

The selector 50 forms a current path (also referred to as filament) between conductive layer 70 and second wiring 20 when a relatively large voltage (referred to as a forming voltage) is applied between the first wiring 10 and the second wiring 20. This forming voltage is, for example, a voltage higher than the threshold voltage. That is, by the forming of the filament, the first wiring 10 and the second wiring 20 are electrically connected via the selector 50. This formation of a filament can be reversed (the filament disappears) according to the potential difference between the first wiring 10 and the second wiring 20.

When too high of a voltage is applied, the magnetoresistance effect element 40 may lose its function as a magnetoresistance effect element 40 (that is, the magnetoresistance effect element 40 may be functionally destroyed) due to dielectric breakdown of the tunnel barrier layer 46. That is, applying a forming voltage at too high a level between the first wiring 10 and the second wiring 20 may cause the breakdown of the tunnel barrier layer 46. Therefore, it is desirable that excessive voltage not be applied to the magnetoresistance effect element 40.

In the semiconductor memory device 100 of the first embodiment, the first protrusion portion 75, which functions as a part of a filament, is formed on the conductive layer 70 in advance. Therefore, it is possible to avoid applying a forming voltage that is substantially greater than the threshold voltage between the first wiring 10 and the second wiring 20. That is, since a large forming voltage can be avoided, the occurrence of a breakdown of the tunnel barrier layer 46 can be avoided and the functions, such as stable writing and reading, can be maintained for the magnetoresistance effect element 40.

Figure 5A:
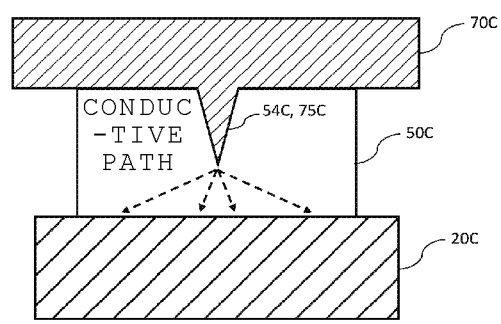
FIG. 5A is a cross-sectional view showing a conductive path generated when writing and reading data in a semiconductor memory device according to a comparative example.

In the semiconductor memory device of the comparative example shown in FIG. 5A, the first recess portion 25 is not formed in the second wiring 20C and thus an edge portion 28 does not exist. Therefore, a plurality of different current paths may occur during data writing and reading operations.

Figure 5B:
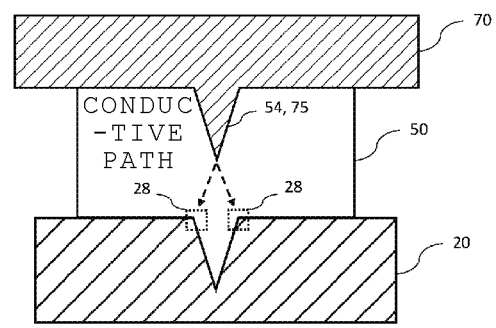
FIG. 5B is a cross-sectional view showing a conductive path generated when writing and reading data of a semiconductor memory device according to a first embodiment.

On the other hand, in the semiconductor memory device 100 of the first embodiment, as shown in FIG. 5B, the current paths are concentrated at the edge portions 28 of the first recess portion 25 where the electric field concentration is likely to occur during the data writing and reading operations, and thus, possible variations in the threshold voltage Vth can be prevented.

(1)-(b) Manufacturing Method

A manufacturing method of the semiconductor memory device of the first embodiment will be described with reference to FIGS. 6 to 19.

Figure 6:
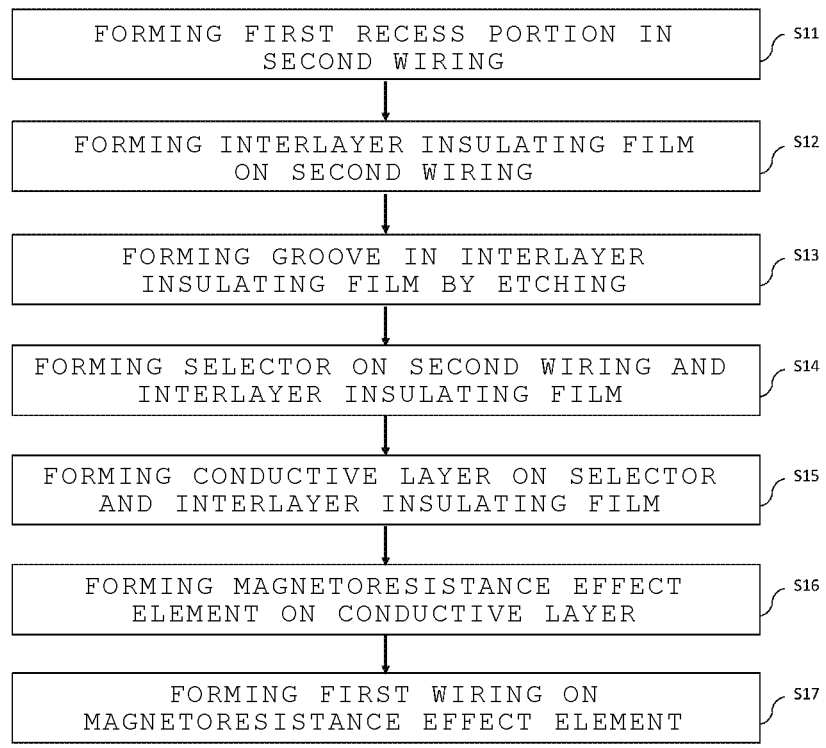
FIG. 6 depicts a sequence of processes in a manufacturing method according to a first embodiment.

FIG. 6 is a diagram showing various processes in the manufacturing method of a semiconductor memory device 100.

(Step S11: Process of Forming First Recess Portion in Second Wiring)

Figure 7:
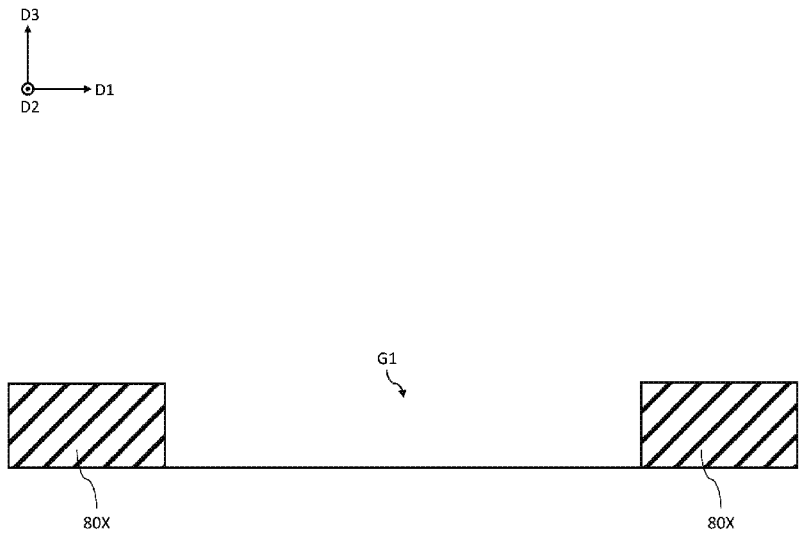
FIG. 7 is a diagram illustrating aspects of a manufacturing method according to a first embodiment.

As shown in FIG. 7, an interlayer insulating film forming portion 80X is formed on a semiconductor substrate. At this time, grooves G1 extending lengthwise along the second direction D2 are formed on the semiconductor substrate, Multiple grooves G1 may be formed spaced from each other in the first direction D1 at predetermined intervals.

Figure 8:
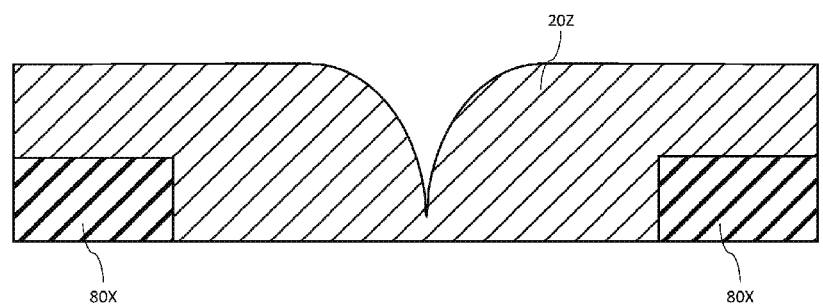
FIG. 8 is a diagram illustrating aspects of a manufacturing method according to a first embodiment.

As shown in FIG. 8, a second wiring forming portion 20Z is formed using a film forming technique such as a chemical vapor deposition (CVD) method so as to cover the inside of the grooves G1 and the interlayer insulating film forming portion 80X on the semiconductor substrate.

At this time, the upper surface of the second wiring forming portion 20Z is recessed according to the shape of the groove G1. The second wiring forming portion 20Z thus itself has a groove corresponding to the groove G1 extending lengthwise along the second direction D2 on the upper surface of the second wiring forming portion 20Z.

Figure 9:
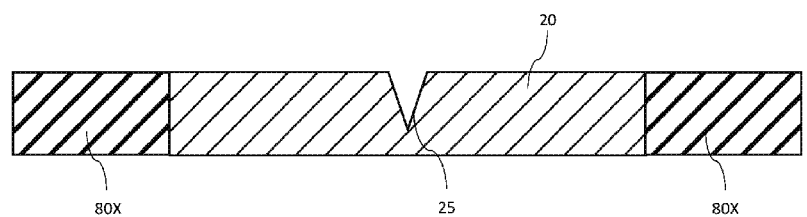
FIG. 9 is a diagram illustrating aspects of a manufacturing method according to a first embodiment.

Next, a planarization process is performed using the upper surface of the interlayer insulating film forming portion 80X as a stopper. The planarization process is performed by using, for example, a chemical mechanical polishing (CMP) method. In this way, the second wiring 20 having the first recess portion 25 shown in FIG. 9 is formed.

If the size of the groove formed on the upper surface of the second wiring forming portion 20Z is insufficient, a recess forming process (an etch-back process) can be performed on the second wiring forming portion 20Z. By such an etch-back process, the second wiring 20 having the first recess portion 25 shown in FIG. 9 can also be formed.

Figure 10:
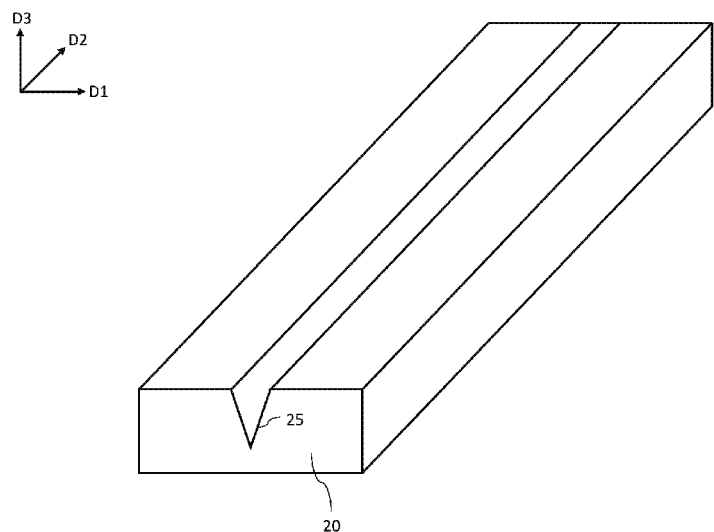
FIG. 10 is a perspective view of a second wiring according to a first embodiment.

FIG. 10 is a perspective view of the second wiring 20 in which the first recess portion 25 has been formed. The first recess portion 25 is formed extending lengthwise along the second direction D2. The illustration of the interlayer insulating film forming portion 80X is omitted from FIG. 10.

(Step S12: Process of Forming Interlayer Insulating Film on Second Wiring)

Figure 11:
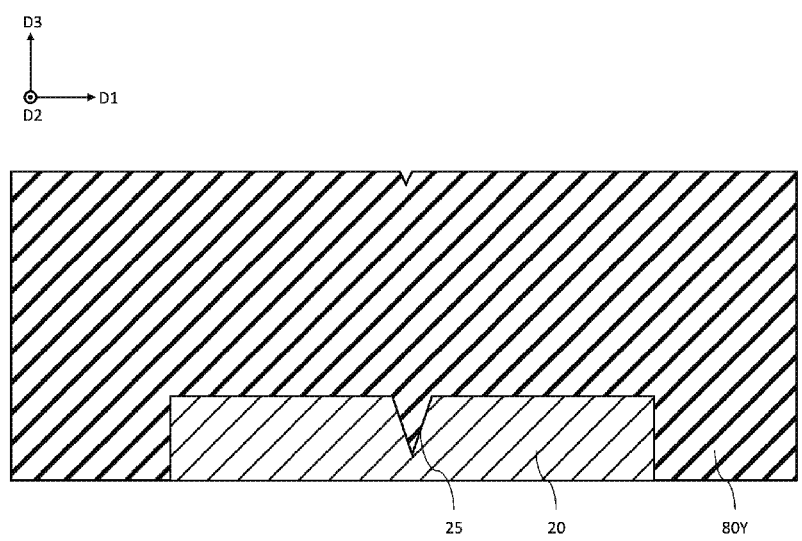
FIG. 11 is a diagram illustrating aspects of a manufacturing method according to a first embodiment.

As shown in FIG. 11, an interlayer insulating film forming portion 80Y is formed on the second wiring 20 by using a film forming technique such as a CVD method. The interlayer insulating film forming portion 80Y is, for example, a silicon oxide ($SiO_2$) layer. According to the shape of the first recess portion 25, the upper surface of the interlayer insulating film forming portion 80Y may also be partially recessed in a region corresponding in position to the first recess portion 25 thus forming a corresponding groove extending along the second direction D2 on the upper surface of the interlayer insulating film forming portion 80Y.

Figure 12:
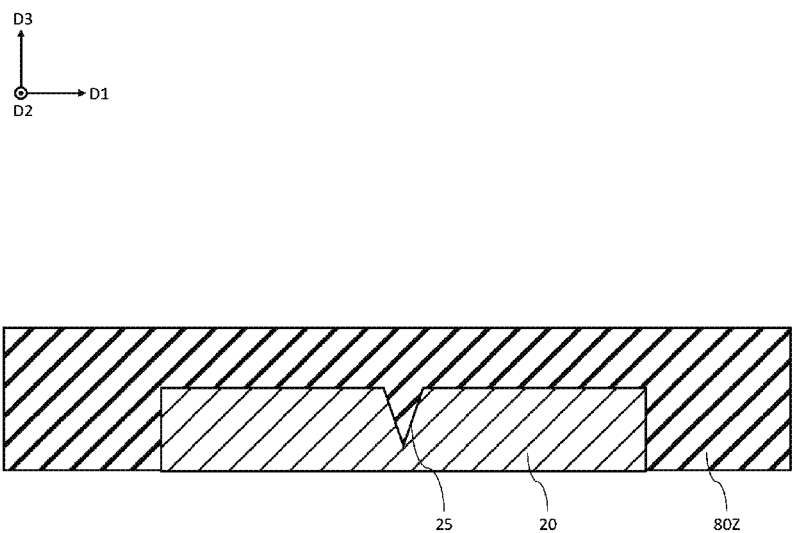
FIG. 12 is a diagram illustrating aspects of a manufacturing method according to a first embodiment.

By performing a planarization process on the interlayer insulating film forming portion 80Y, the interlayer insulating film forming portion 80Z shown in FIG. 12 is formed.

(Step S13: Process of Forming Groove in Interlayer Insulating Film by Etching)

Figure 13:
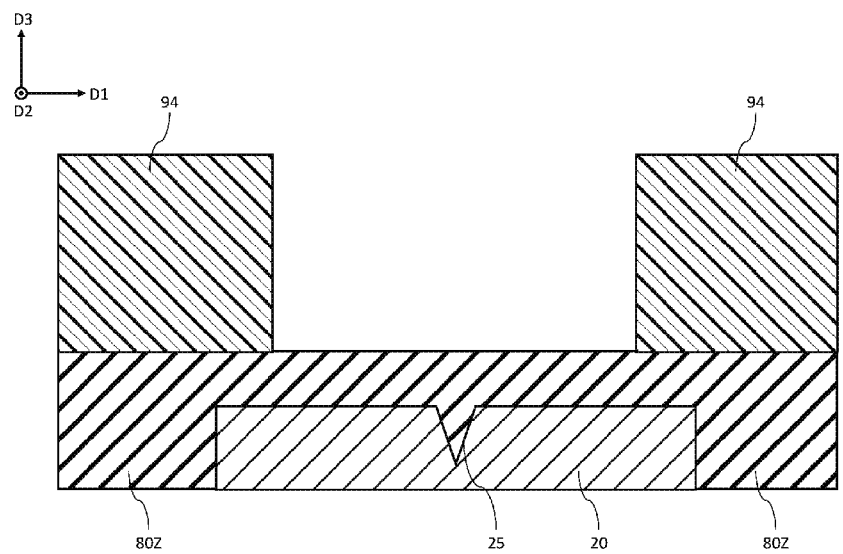
FIG. 13 is a diagram illustrating aspects of a manufacturing method according to a first embodiment.

As shown in FIG. 13, a mask layer 94 having a predetermined pattern is formed on the interlayer insulating film forming portion 80Z. The mask layer 94 may be formed from a resist layer patterned by photolithography or other known lithography techniques. In some examples, the pattern of the mask layer 94 can be formed by well-known lithography techniques in combination with well-known etching techniques. The mask layer 94 forms, for example, a rectangular parallelepiped shape extending in the second direction D2. Etching can be performed using the pattern of the mask layer 94 as an etch mask until the upper surface of the second wiring 20 is exposed. Then, the mask layer 94 can be removed/stripped.

Figure 14:
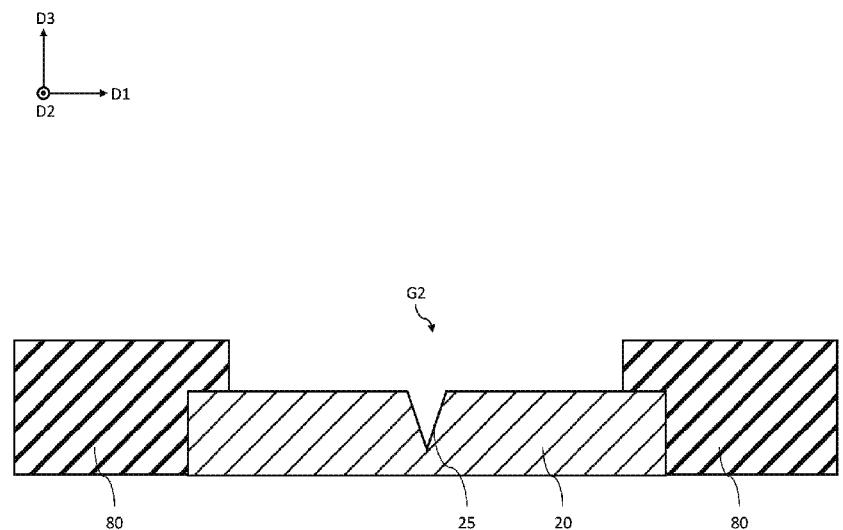
FIG. 14 is a diagram illustrating aspects of a manufacturing method according to a first embodiment.

In this way, as shown in FIG. 14, a groove G2 surrounded by the upper surface of the second wiring 20, the first recess portion 25, and the interlayer insulating film 80 and extending in the second direction D2 can be formed.

(Step S14: Process of Forming Selector on Second Wiring and Interlayer Insulating Film)

Figure 15:
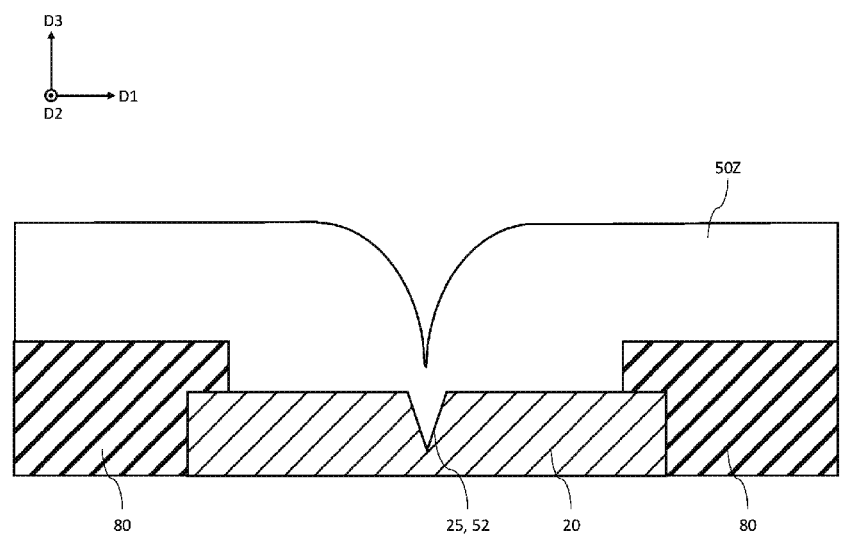
FIG. 15 is a diagram illustrating aspects of a manufacturing method according to a first embodiment.

Thereafter, as shown in FIG. 15, a selector forming portion 50Z is formed on the second wiring 20 and the interlayer insulating film 80 by a film forming technique such as a CVD method. At this time, the selector forming portion 50Z is formed so that the selector forming portion 50Z fills the first recess portion 25. Asa result, the second protrusion portion 52 is formed on the lower surface of the selector forming portion 50Z according to the shape of the first recess portion 25 already formed on the second wiring 20. The upper surface of the selector forming portion 50Z can be similarly recessed as a groove extending lengthwise along the second direction D2.

Figure 16:
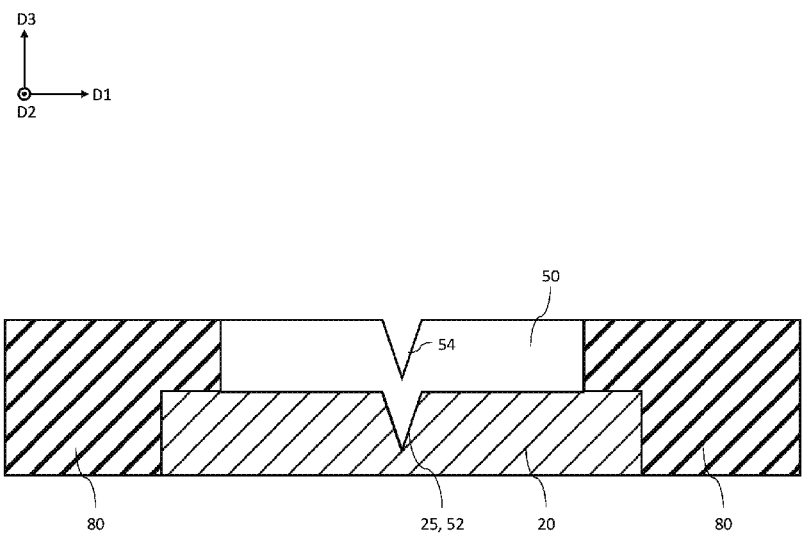
FIG. 16 is a diagram illustrating aspects of a manufacturing method according to a first embodiment.

As shown in FIG. 16, using the upper surface of the interlayer insulating film 80 as a stopper, a planarization process is performed on the selector forming portion 50Z to form the selector 50. As a result, the upper surface of the selector 50 is aligned with the upper surface of the interlayer insulating film 80. In this way, the second recess portion 54 is formed on the upper surface of the selector 50. In this planarization process, the groove on the upper surface of the selector 50 may almost disappear. In that case, a recess forming process (etch-back process) can be performed on the selector 50 so that the groove after planarization processing has a sufficient size. In this way, the second recess portion 54 is formed on the upper surface of the selector 50.

(Step S15: Process of Forming Conductive Layer on Selector and Interlayer Insulating Film)

Figure 17:
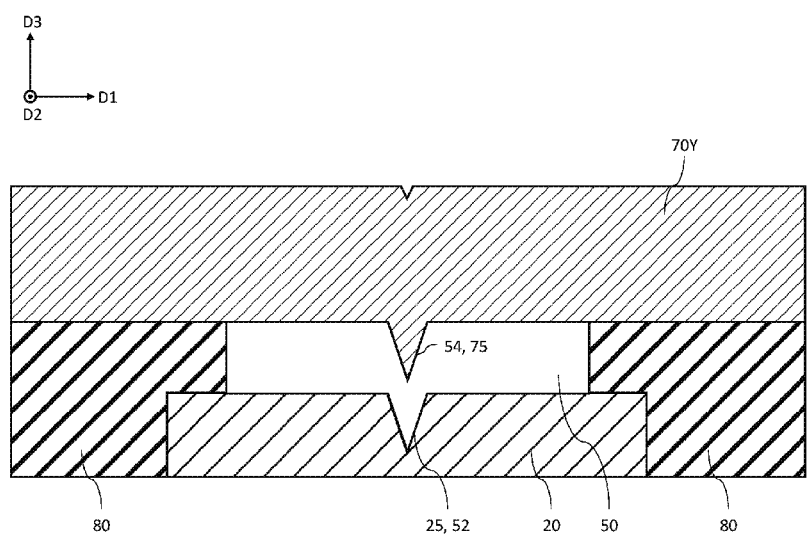
FIG. 17 is a diagram illustrating aspects of a manufacturing method according to a first embodiment.

As shown in FIG. 17, a conductive layer forming portion 70Y is formed on the selector 50 and the interlayer insulating film 80 by a film forming technique such as a CVD method. At this time, the conductive layer forming portion 70Y is deposited so that the conductive layer forming portion 70Y fills the second recess portion 54. As a result, the first protrusion portion 75 is formed on the lower surface of the conductive layer forming portion 70Y according to the shape of the second recess portion 54 formed on the selector 50. Likewise, the upper surface of the conductive layer forming portion 70Y has a groove extending along the second direction D2 corresponding in position to the second recess portion 54.

Figure 18:
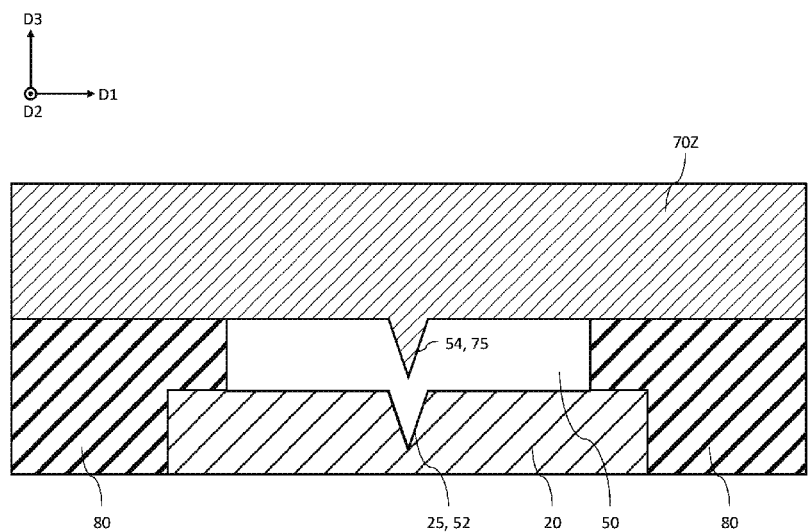
FIG. 18 is a diagram illustrating aspects of a manufacturing method according to a first embodiment.

When the conductive layer 70 and the magnetoresistance effect element 40 are to be directly stacked on each other, a planarization process is performed on the conductive layer forming portion 70Y. Thus, as shown in FIG. 18, a conductive layer forming portion 70Z is formed. When the conductive layer 70 and the magnetoresistance effect element 40 are not to be directly stacked, the lower electrode 62 may be formed on the conductive layer 70 with the recess portion still left on the upper surface of the conductive layer 70. That is, intermediate planarization of conductive layer forming portion 70Y may be omitted.

(Step S16: Process of Forming Magnetoresistance Effect Element on Conductive Layer)

Next, a manufacturing method of the magnetoresistance effect element 40 and the like formed above the conductive layer forming portion 70Z will be described.

First, the lower electrode 62 is formed on the conductive layer forming portion 70Z by, for example, sputtering. When the lower electrode 62 and the magnetoresistance effect element 40 are to be directly stacked, a planarization process is performed on the lower electrode 62.

The magnetoresistance effect element 40 is formed on the lower electrode 62 by, for example, sputtering.

The magnetoresistance effect element 40 includes, for example, a base layer 44, a storage layer 45, a tunnel barrier layer 46, a reference layer 47, an intermediate layer 48, and a shift cancellation layer 49. The base layer 44 is formed on the lower electrode 62. The storage layer 45 is formed on the base layer 44. The tunnel barrier layer 46 is formed on the storage layer 45. The reference layer 47 is formed on the tunnel barrier layer 46. The intermediate layer 48 is formed on the reference layer 47. The shift cancellation layer 49 is formed on the intermediate layer 48.

The upper electrode 64 is formed on the shift cancellation layer 49 by, for example, sputtering.

The hard mask 66 is formed on the upper electrode 64 by, for example, sputtering. The hard mask 66 is formed into a predetermined pattern by a lithography technique and an etching technique. The hard mask 66 is patterned based on the intended shape of the magnetoresistance effect element to be formed. For example, the hard mask 66 may be processed into a circle shape or the like. The material of the hard mask 66 includes, for example, at least one of a material and a nitride thereof, such as tungsten (W), tantalum (Ta), titanium (Ti), carbon (C), tungsten nitride (WN), tantalum nitride (TaN), or titanium nitride (TiN).

Etching, such as ion beam etching (IBE), is performed on the stacked structure (that is, the magnetoresistance effect element 40, the lower electrode 62, the upper electrode 64, and the conductive layer 70) above the selector 50 using the hard mask 66 as an etch mask.

The magnetoresistance effect element 40, the lower electrode 62, the upper electrode 64, and the conductive layer 70 are thus processed into a shape corresponding to the hard mask 66 by IBE or other etching processes. For example, the magnetoresistance effect element 40 is irradiated with the ion beam from an angle inclined with respect to the surface of the semiconductor substrate. The type of etching method for the magnetoresistance effect element 40 is not limited to IBE.

Figure 19:
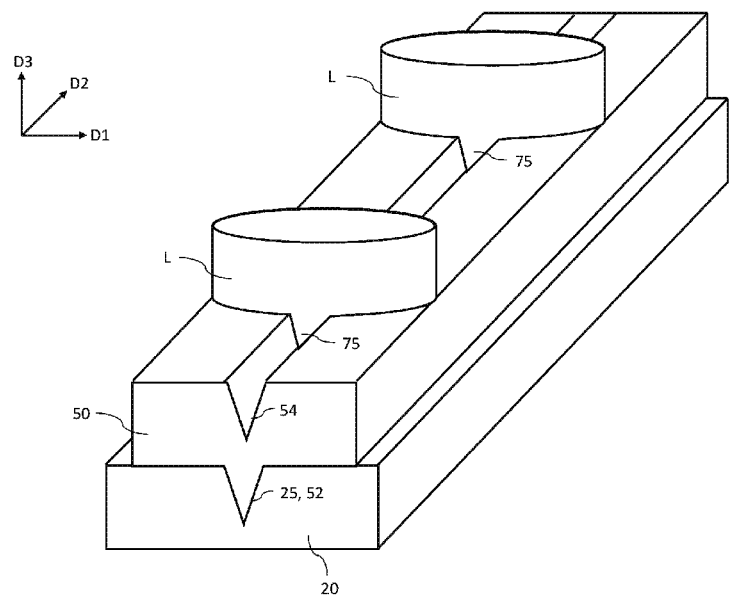
FIG. 19 is a perspective view of a semiconductor memory device according to a first embodiment.

Through the above processes, the stacked body L, shown in the perspective view of FIG. 19, including the magnetoresistance effect element 40, the lower electrode 62, the upper electrode 64, the conductive layer 70, and the hard mask 66 is formed.

FIG. 19 is a perspective view in which the stacked body L is formed on the selector 50. The illustration of the interlayer insulating film 80 is omitted from FIG. 19 for simplification of description. A plurality of stacked bodies L having a circular shape when viewed from the third direction D3 are formed at predetermined intervals along the second direction D2. The shape here is not limited to a perfect circle and includes approximately circular shapes and others that achieve substantially the same effects as the first embodiment. The second recess portion 54, extending in the second direction D2, is shared by a plurality of memory cells 30 that each share a particular second wiring 20. These memory cells 30 are provided at predetermined intervals along the second direction D2 of the second recess portion 54, which extends uninterruptedly between adjacent memory cells 30.

(Step S17: Process of Forming First Wiring on Magnetoresistance Effect Element)

Thereafter, the manufacturing process of the semiconductor memory device 100 is completed by forming the first wiring 10 on the hard mask 66. In this way, the semiconductor memory device 100 having the cross-sectional structure shown in FIG. 3 can be obtained.

In the semiconductor memory device 100, the first protrusion portion 75 is formed in the conductive layer 70 during manufacturing, and thus the process of applying a large forming voltage between the first wiring 10 and the second wiring 20 can be omitted or relaxed.

That is, the functioning of the magnetoresistance effect element 40 can be guaranteed since a process (application of large forming voltages) that might result in the occurrence of a breakdown of the tunnel barrier layer 46 can be avoided.

Furthermore, by including an edge portion 28 that causes electric field concentration in the first recess portion 25 on the upper surface of the second wiring 20, variations in the threshold voltage Vth can be prevented.

(2) Modification of First Embodiment

Figure 20:
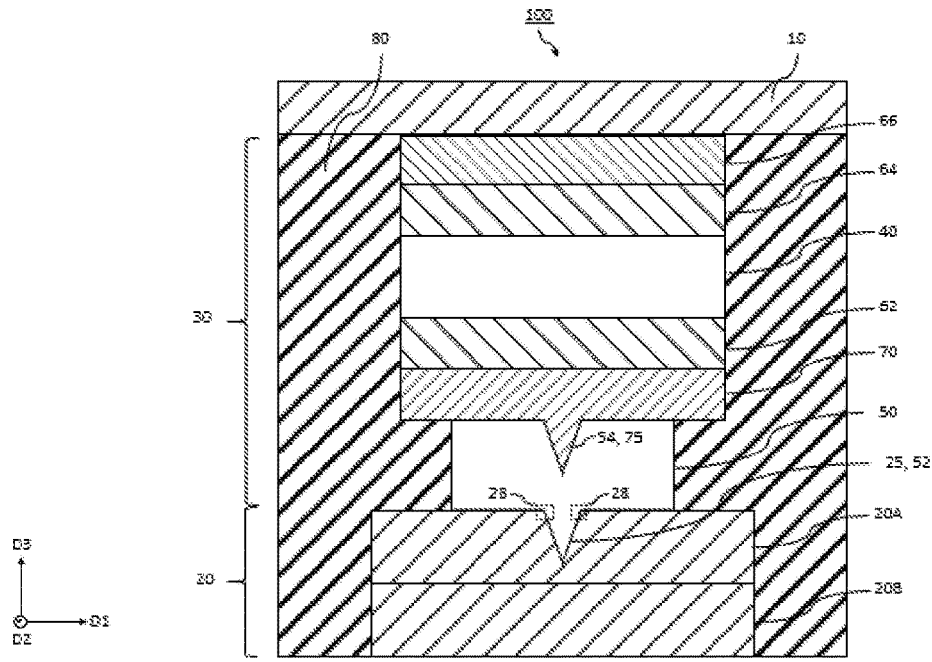
FIG. 20 is a cross-sectional view of a semiconductor memory device according to a modification of a first embodiment.

With reference to FIG. 20, a semiconductor memory device 100 and a manufacturing method thereof according to a modification of the first embodiment will be described.

As shown in FIG. 20, the second wiring 20 is divided into a second wiring portion 20A and a second wiring portion 20B, the first recess portion 25 is formed on the upper surface of the second wiring portion 20A, and then integrated with the second wiring portion 20B to form one second wiring 20. In this way, two wiring portions having the same or different material composition may be separately processed, and then these two wiring portions may be integrated to form one wiring. In the present modification, since a cross-sectional area of the second wiring 20 can be increased, resistance can be reduced. This is particularly useful when the semiconductor memory device 100 has a finer structure or better device properties, such as increased write/read speed and reduced power consumption, are required.

The second wiring portion 20A and the second wiring portion 20B may have different material compositions. For example, the second wiring portion 20A includes tantalum nitride (TaN) and titanium (Ti), and the second wiring portion 20B includes tantalum nitride (TaN) and tungsten (W).

(3) Second Embodiment

Figure 21:
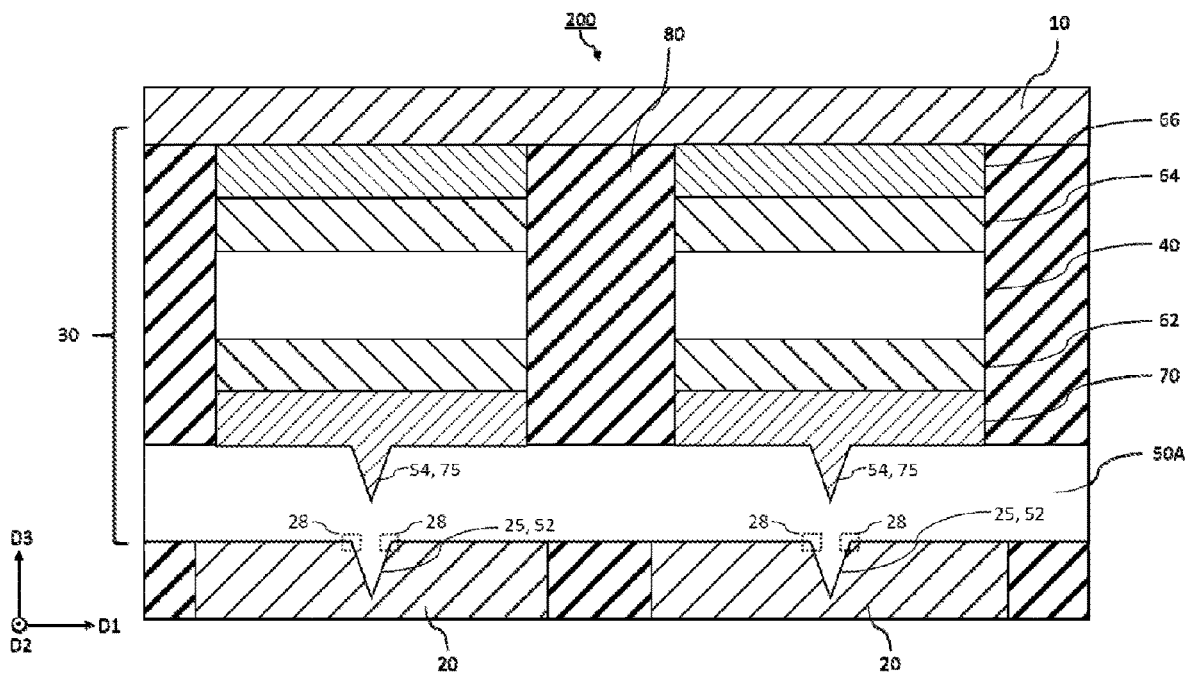
FIG. 21 is a cross-sectional view of a semiconductor memory device according to a second embodiment.

With reference to FIG. 21, a semiconductor memory device 200, and a manufacturing method thereof according to a second embodiment will be described.

The semiconductor memory device 200 according to the second embodiment differs from the semiconductor memory device 100 in that a selector 50A is shared with the plurality of memory cells 30 that share a first wiring 10.

In the manufacturing method of the semiconductor memory device 200 according to the second embodiment, after the selector 50A is formed on the second wiring 20 and the interlayer insulating film 80, the selector 50A is not processed to into separated portions for each of the adjacent memory cells 30. The processes after forming the selector 50A are otherwise the same as those in the manufacturing method of the first embodiment.

In the manufacturing method of the semiconductor memory device 200, since the selector 50A is shared with the plurality of memory cells 30 that share the first wiring 10, the manufacturing process can be reduced as compared with the case where the selector 50 is divided by the interlayer insulating film 80 for each memory cell 30. As a result, the manufacturing yield of the semiconductor memory device 200 obtained by the manufacturing method of the second embodiment can be improved.

The structure described above as the modification of the first embodiment can also be applied to the second embodiment. That is, the second wiring 20 can be comprised of different portions (e.g., second wiring portions 20A and 20B).

(4) Other Modifications

In each of the above-described embodiments, the width of the selector 50 in the first direction D1 is narrower than the width of the second wiring 20 in the first direction D1. However, the present disclosure is not limited thereto. That is, the width of the selector 50 in the first direction D1 may be the same as the width of the second wiring 20 in the first direction D1 depending on the manufacturing process, and the similar effects as described above can still be obtained.

In each of the above-described embodiments, the base layer 44, the intermediate layer 48, and the shift cancellation layer 49 are configured as magnetoresistance effect element 40. However, the present disclosure is not limited to such a configuration. These layers need not necessarily be provided in the magnetoresistance effect element 40. That is, in general, the magnetoresistance effect element 40 may have any configuration as long as the configuration can store different data values and/or information according to the resistance state thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first wiring extending in a first direction;
a second wiring extending in a second direction intersecting the first direction and spaced from the first wiring in a third direction intersecting the first direction and the second direction, the second wiring having a first recess in a first upper surface facing the first wiring, the first recess extending from an uppermost edge portion of the first upper surface into the second wiring in the third direction;
a resistance change memory element connected between the first and second wirings;
a conductive layer between the resistance change memory element and the second wiring and including a first protrusion on a surface facing the second wiring; and a switching portion between the conductive layer and the second wiring and including a second recess in a second upper surface facing the conductive layer and a second protrusion on a surface facing the second wiring, the second recess extending from the second upper surface into the switching portion in the third direction, wherein the first protrusion is in the second recess, a lowermost portion of the first protrusion is at a position along the third direction that is above a position of the uppermost edge portion of the first surface along the third direction, the second protrusion is in the first recess, and the switching portion is configured to switch a conductivity state according to a voltage between the first wiring and the second wiring.

2. The semiconductor memory device according to claim 1, wherein the switching portion electrically connects the conductive layer and the second wiring when the voltage between the first wiring and the second wiring exceeds a predetermined threshold value.

3. The semiconductor memory device according to claim 1, wherein the resistance change memory element comprises a magnetic tunnel junction element.

4. The semiconductor memory device according to claim 1, wherein the switching portion extends in the first direction, and a plurality of memory cells spaced from each other along the first direction are connected to the first wiring and the switching portion.

5. The semiconductor memory device according to claim 1, further comprising:

a third wiring directly connected to a surface of the second wiring facing away from the first wiring.

6. The semiconductor memory device according to claim 5, wherein the third wiring has composition different from a composition of the second wiring.

7. The semiconductor memory device according to claim 1, further comprising:

a plurality of conductive layers spaced from each other on the switching portion at predetermined intervals in the second direction.

8. The semiconductor memory device according to claim 7, wherein each of the plurality of conductive layers has a circular shape when viewed from the third direction.

9. The semiconductor memory device according to claim 1, wherein the switching portion includes at least one chalcogen element selected from the group consisting of tellurium, selenium, and sulfur.

10. The semiconductor memory device according to claim 1, wherein the conductive layer comprises at least one of tungsten, tantalum, titanium, tungsten nitride, tantalum nitride, and titanium nitride.

11. The semiconductor memory device according to claim 1, wherein a cross section of the second recess taken parallel to the first and third directions has a V-shape.

12. The semiconductor memory device according to claim 1, further comprising:

a plurality of resistance change memory elements spaced from each other in the second direction along the second wiring, wherein the second recess extends in the second direction and directly contacts each of the plurality of resistance change memory elements.

13. The semiconductor memory device according to claim 1, wherein the uppermost edge portion of the first surface has an angular shape.

14. The semiconductor memory device according to claim 13, wherein the second protrusion corresponds in shape to the first recess.

15. The semiconductor memory device according to claim 14, wherein the uppermost edge portion extends in the second direction beyond an outer edge of the resistance change memory element.

16. The semiconductor memory device according to claim 1, wherein the second protrusion has a pointed tip.

17. The semiconductor memory device according to claim 1, wherein the first protrusion and the second protrusion are aligned in the third direction.

18. The semiconductor memory device according to claim 1, wherein the second recess is in the center, in the first direction, of the switching portion.

19. The semiconductor memory device according to claim 1, wherein the first upper surface is in a first plane, the first upper surface directly contacts a lower surface of the switching portion that is parallel to the first plane, the second upper surface is in a second plane spaced from the first plane in the third direction, the second upper surface directly contacts a lower surface of the conductive layer, and the minimum distance between the second wiring and the conductive layer is from the tip end of the first protrusion to the uppermost edge portion of the first surface.

20. A semiconductor memory device, comprising:

a first wiring extending in a first direction;

a plurality of second wirings extending in a second direction intersecting the first direction, each second wiring spaced from each other in the first direction and the second wiring spaced from the first wiring in a third direction intersecting the first and second directions, each second wiring including a first recess on a surface facing the first wiring;

a first resistance change memory element between the first wiring and one of the plurality of second wirings in the third direction;

a second resistance change memory element spaced from the first resistance change memory element in the first direction, the second resistance change memory element being between the first wiring and another one of the plurality of second wirings;

a first conductive layer between the first resistance change memory element and the one of the plurality of second wirings and including a first protrusion on a surface facing the one of the plurality of second wirings;

a second conductive layer spaced from the first conductive layer in the first direction, the second conductive layer being between the second resistance change memory element and the other one of the plurality of second wirings and including a second protrusion on a surface facing the other one of the plurality of second wirings; and a switching portion extending in the first direction from the first conductive layer to the second conductive layer, the switching portion being between the one of the plurality of second wirings and the first conductive layer and between the other one of the plurality of second wirings and the second conductive layer and the switching portion including a third recess contacting the first conductive layer, a third protrusion contacting the one of the plurality of the second wirings, a fourth recess contacting the second conductive layer, and a fourth protrusion contacting the other one of the plurality of second wirings, wherein a tip end of the first protrusion is at a position along the third direction that is above an uppermost surface of the one of the plurality of second wirings, and a tip end of the fourth protrusion is at a position along the third direction that is above an uppermost surface of the other one of the plurality of second wirings.

\* \* \* \* \*